United States Patent
Watanabe

(10) Patent No.: US 6,353,235 B1
(45) Date of Patent: Mar. 5, 2002

(54) PLASMA DAMAGE DETECTOR AND PLASMA DAMAGE EVALUATION METHOD

(75) Inventor: Hajime Watanabe, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/266,589

(22) Filed: Mar. 11, 1999

(30) Foreign Application Priority Data

Nov. 9, 1998 (JP) .......................................... 10-317330

(51) Int. Cl.[7] .......................... H01L 23/58; H01L 21/66
(52) U.S. Cl. ........................................... 257/48; 438/18
(58) Field of Search .............................. 257/48; 438/14, 438/17, 18, 710, 798

(56) References Cited

U.S. PATENT DOCUMENTS 5,598,009 A * 1/1997 Bui

FOREIGN PATENT DOCUMENTS

| JP | 7-78829 | 3/1995 |
| JP | 10-79407 | 3/1998 |

OTHER PUBLICATIONS

Watanabe et al., "Effect of Plasma–Induced Damage on MOSFET Reliability," Technical Report of IEICE, 1995, pp. 37–41 [not fully translated].*

Mistry et al, "Effect of Plasma–Induced Charging Damage on n–Channel and p–Channel MOSFET Hot Carrier Reliability," IRPS , 1994;.

Nariani et al, "Gate Antenna Structures for Monitoring Oxide Quality and Reliability," ICMTS, 1995;.

Watanabe et al, "Effect of Plasma–Induced Damage on MOSFET Reliability," Technical Report of IEICE, 1995 (with partial translation).

* cited by examiner

Primary Examiner—Charles Bowers
Assistant Examiner—Evan Pert
(74) Attorney, Agent, or Firm—Burns, Doane, Swecker & Mathis, LLP

(57) ABSTRACT

A detection test structure making a high-sensitivity detection of damage to gate insulating films from charges entering into contact or through holes during plasma processes is achieved to make a low-cost, high-precision, short-time evaluation of the damages. A plasma damage detector (PD1) comprising an MOS transistor (M1), a first layer wire (IL1), a contact hole group (H10), and a second layer wire (IL2) is integrally formed with a product wafer in the fabrication of the product wafer. After the completion of the product wafer, a lifetime of the MOS transistor (M1) is estimated by measuring a parameter (e.g., gate or substrate current during the application of hot carrier stress) of the MOS transistor (M1) in the detector (PD1) for a short time and examining previously obtained correlation records between a lifetime and the parameter, to evaluate plasma damage.

15 Claims, 9 Drawing Sheets

F I G . 1
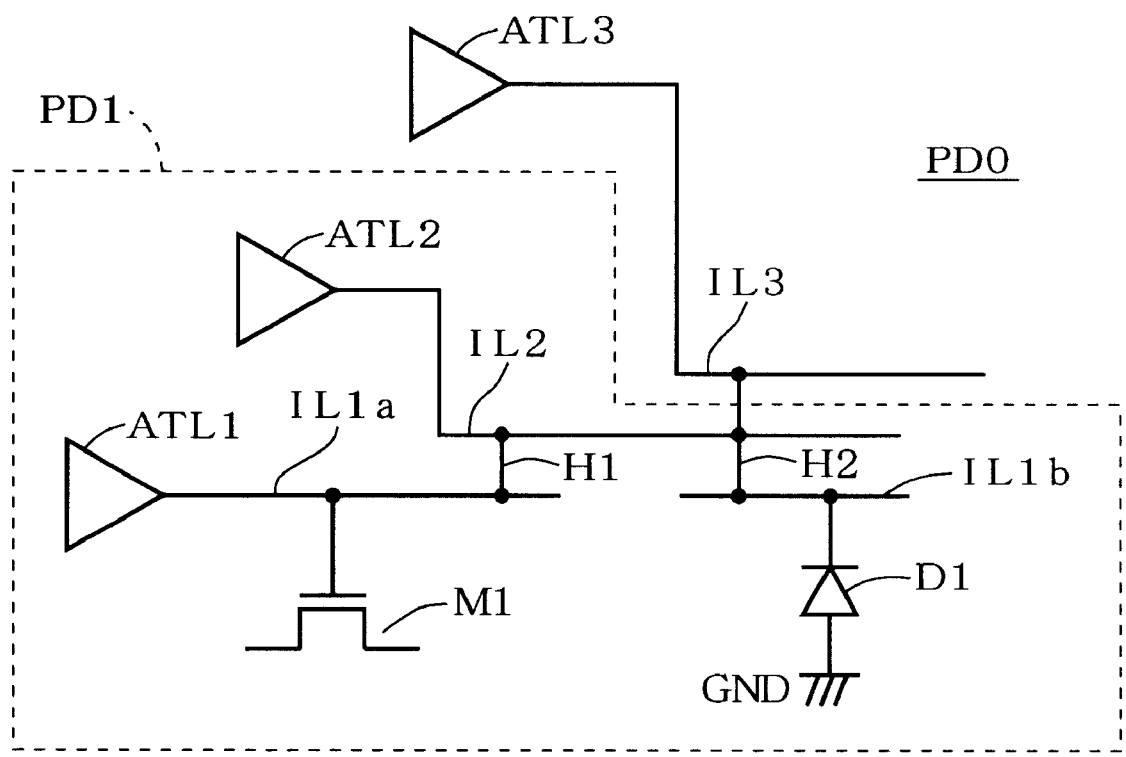

PLASMA DAMAGE DETECTOR AND PLASMA DAMAGE EVALUATION METHOD

BACKGROUND OF THE INVENTION

1. Field of the Invention

The present invention relates to a detector detecting plasma-induced damage to gate insulating films in MOS structures during the semiconductor fabrication process, and it also relates to a damage evaluation method.

2. Description of the Background Art

A recent trend toward higher-density semiconductor devices has been increasing the use of high damage processes in the fabrication of semiconductor devices. Especially plasma processes using high-energy charges have a great impact on semiconductor devices. Thus, recent studies have been directed toward damage-reduced plasma processes. At the same time, the need for a high-sensitivity plasma-induced damage detector and a method for making a low-cost, high-precision, short-time damage detection have arisen.

One of the problems with the plasma-induced impact on semiconductor devices is charging damage to gate insulating films in MOS structures. FIGS. 5 and 6 schematically illustrate this problem.

In FIG. 5, a chamber CB comprises plasma producing mechanisms GN for producing plasma gas PG while holding a wafer WF by a lower electrode (not shown). The plasma gas PG produced in the chamber CB sends charges CH to the wafer WF. The charges CH react with materials on the surface of the wafer WF to apply, for example, etching to the surface. Of the charges CH, some of electrons E1 enter into wiring, etc. formed on the surface of the wafer WF. These electrons E1 either stay in the wafer WF, or return from the wafer WF back to the plasma gas PG, or go through the wafer WF and escape to the ground through the lower electrode (not shown).

FIG. 6 schematically shows a MOS transistor M1 on the surface of the wafer WF in FIG. 5 during a plasma process. The MOS transistor M1 consists of a gate electrode G and a gate insulating film OX formed on the surface of a substrate SUB isolated by element isolation regions IR that are formed by the LOCOS method, etc., and source/drain regions S, D with impurities doped therein. On the upper surface of the gate electrode G, an interlayer insulating film (not shown) is formed and a wire IL2 is formed on top of that. The wire IL2 is connected to the gate electrode G by a contact hole H1 formed in the interlayer insulating film.

On applying a plasma process to such a MOS transistor M1, the charge CH is sent to the vicinity of the wiring IL2 as shown in FIG. 6. Of the charge CH, some of electrons (E11, E12, E13) enter into the wire IL2. Here, these electrons are classified into three groups according to their entering forms, namely, electrons E11 going through the wire IL2 and entering directly into the contact hole H1; electrons E12 entering into the wire IL2 from the side surfaces; and electrons E13 entering into the wire IL2 from the upper surface. The electrons E11, E12, and E13 try to move to the gate electrode G to flow to the substrate SUB. As a higher-density MOS transistor M1 has a thinner gate insulating film OX, the Fowler-Nordheim tunneling current FN caused by the movement of the electrons E11, E12, and E13 flows easily (but arrows in FIG. 6 indicate a flow of electrons). This flow of the tunneling current FN often causes trapping of some of electrons E11, E12, and E13 in the gate insulating film OX, generating defects in the gate insulating film OX. Depending on the degree of defects, dielectric breakdown may be developed.

Such defects are illustrated in FIGS. 7A to 7C. The drawings show a cross section of a MOS transistor M1 consisting of a gate electrode G, a gate insulating film OX, and side walls SW all formed on the P-type substrate SUB, and an N-type source electrode S and an N-type drain electrode D both formed in the substrate SUB. This MOS transistor M1 is of N-channel type. FIG. 7A shows that electrons E1 caused by plasma charging flow from the gate electrode G to the substrate SUB through the gate insulating film OX. FIG. 7B shows that the trapped electrons E1 are annealed out by heat treatment. The defects in the gate insulating film OX will recover by this annealing somewhat but not completely, so that trap levels TL remain. In this state, as shown in FIG. 7C, the source electrode S is grounded to apply voltages Vgs, Vds and Vsub to the gate electrode G, the drain electrode D, and the substrate SUB, respectively. At this time, the electrons E2 that migrate from the source electrode S to the drain electrode D tend to be hot carriers in the vicinity of the drain electrode D. When the hot-carrier electrons E2 collide with atoms in the substrate SUB, producing electron-hole pairs, some of newly produced holes P1 turn to be a substrate current Isub that flows in the direction of the voltage Vsub, and some of newly produced electrons E3 move in the direction of the voltage Vgs to be a gate current Ig. However, the electrons E3 are trapped in the trap levels TL in the gate insulating film OX. That is, an application of electrical stress to the N-channel MOS transistor M1 often causes charge trapping in the gate insulating film OX in a short time. Accordingly, a repetition of such electrical stress accelerates degradation in transistor characteristics.

As a method for evaluating the degradation level of a gate insulating film deteriorated by such plasma damage, there were, for example, the CVS (Constant Voltage Stress) method and the CCS (constant Current Stress) method both utilizing a wafer with a large-area TEG (Test Element Group) having a large number of gate insulating films. The former was a method for evaluating the degradation level by examining degradation with times from the time a constant voltage is applied to a damaged gate insulating film to the time dielectric breakdown of the film occurs. The latter was a method for evaluating the degradation level by examining the amount of charge injected during a period between the application of a constant current to a damaged gate insulating film and the occurrence of dielectric breakdown of the film.

Alternatively, there were also the SPV (Surface Photo Voltage) method for evaluating degradation by measuring surface photoelectromotive force of each element to examine a potential distribution by the use of a wafer with a large-area TEG having a large number of gate insulating films, and then identifying information on the trap levels; and a method for evaluating degradation by calculating the amount of charge injection from current-voltage characteristics, using a wafer with a large-area TEG having a large number of EEPROMs (Electrical Erasable and Programmable ROM).

However, these conventional plasma damage evaluation methods utilized a TEG-equipped wafer dedicated for damage detection, and fabrication of such a dedicated wafer increases manufacturing cost. Such dedicated wafers were also not necessarily fabricated under the same conditions as a product wafer, so that the evaluation thereof would not be identical with that of the product wafer. Further, because of their low damage measuring sensitivity and long measuring time, the methods were not desirable to obtain sufficiently effective data.

As an alternative of these measuring methods, there has been developed a technique for fabricating a TEG for degradation detection of gate insulating films integrally with a product wafer in the fabrication of the product wafer, thereby obtaining the same process conditions as the product wafer and also reducing the manufacturing cost.

The Japanese Patent Laid-Open No. 10-79407A, for example, discloses a device in which through an interlayer insulating film, metal wires are densely formed on a gate electrode of an MOS capacitor formed integrally with a product wafer, and those metal wires are used as high-sensitivity plasma damage antennas; and a method utilizing the device, for evaluating a degradation level by examining the amount of charge injected until the occurrence of dielectric breakdown of insulating films in the MOS capacitor.

Another Japanese Patent Laid-Open No. 7-78829A discloses, as an experimental device for detecting plasma damage with high sensitivity, a plasma damage detector PD2 with a pectinate antenna AT1 shown in FIG. 8 and a plasma damage detector PD3 with a large-area antenna AT2 shown in FIG. 9.

The detector PD2 comprises a similar MOS transistor M1 to that in FIG. 6. More specifically, the MOS transistor M1 consists of the gate insulating film OX and the gate electrode G formed on the surface of the substrate SUB isolated by the element isolation regions IR that are formed by the LOCOS method, etc., and the source/drain regions S, D with carriers injected therein. The pectinate anterna AT1 is then formed in series with the gate electrode G. Having a large antenna circumference, the pectinate antenna AT1 can readily accumulate charges entering from the side surfaces, e.g., the electrons E12 in FIG. 6. In this respect, it is ideal for detecting charging damage by plasma etching with high sensitivity. This is because forming a wiring portion into a pectinate antenna by means of etching causes a reaction in the periphery of the pectinate antenna with resists, which allows easy entrance of the electrons from the side surfaces.

The detector PD3 comprises a similar MOS transistor M1 to that of the detector PD2, in which the large-area antenna AT2 is formed in series with the gate electrode G. The large-area antenna AT2 can readily accumulate charges entering from the upper surface, e.g., the electrons E13 in FIG. 6. In this respect, it is ideal for detecting charging damage by plasma ashing with high sensitivity. This is because ashing causes a reaction on the entire surface of resists formed on the large-area antenna AT2, which allows easy entrance of the electrons from the upper surface.

In both structures of the detectors PD2 and PD3, however, it was difficult to readily accumulate charges entering directly into contact holes between the wire and the gate electrode or into through holes between multilayer interconnections, e.g. the electrons E11 in FIG. 6.

SUMMARY OF THE INVENTION

A first aspect of the present invention is directed to a plasma damage detection test structure comprising: a semiconductor substrate having a surface; first and second current electrodes provided apart from each other in the surface of the semiconductor substrate; an insulating film provided on the surface of the semiconductor substrate sandwiched between the first and second current electrodes; a control electrode opposed to the semiconductor substrate with the insulating film therebetween; a first wire connected to the control electrode; a second wire connected to the first wire and located farther from the semiconductor substrate than the first wire; and a plurality of contact or through holes which intervene between the first wire and the second wire and which is located across the first and second wires.

According to a second aspect of the present invention, the plasma damage detection test structure of the first aspect further comprises: a diode whose anode is grounded and whose cathode is connected to the second wire.

A third aspect of the present invention is directed to a plasma damage evaluation method using a plasma damage detection test structure comprising a semiconductor substrate having a surface, first and second current electrodes provided apart from each other in the surface of the semiconductor substrate, an insulating film provided on the surface of the semiconductor substrate sandwiched between the first and second current electrodes, a control electrode opposed to the semiconductor substrate with the insulating film therebetween, a first wire connected to the control electrode, a second wire connected to the first wire and located farther from the semiconductor substrate than the first wire, a plurality of contact or through holes intervening between the first wire and the second wire and located across the first and second wires; and a diode whose anode is grounded and whose cathode is connected to the second wire. The plasma damage evaluation method comprises the steps of: applying a first voltage between the first and second current electrodes; measuring a parameter of the plasma damage detector in applying a second voltage between the control electrode and the second current electrode; and evaluating plasma damage by estimating a value of a hot carrier lifetime from a known correlation between the hot carrier lifetime and the parameter.

A fourth aspect of the present invention is directed to a plasma damage evaluation method comprising the steps of: (a) preparing a semiconductor substrate having a surface; (b) forming a first conductive material on the surface; (c) patterning the first conductive material to form a first wire; (d) forming an interlayer insulating film so as to cover the first wire; (e) forming a plurality of contact or through holes in the interlayer insulating film across the first wire; (f) forming a second conductive material so as to fill the plurality of contact or through holes; and (g) patterning the second conductive material to form a second wire.

The plasma damage detection test structure of the first aspect achieves high-sensitivity detection of damage to the insulating films from the charge entering directly into the contact or through holes during the plasma process.

The plasma damage detection test structure of the second aspect sends the charge entering into the second wire during the plasma process to the ground, excepting the charge entering directly into the contact or through holes between the first and second wires. It thus achieves high-sensitivity detection of damage to the insulating films only from the charge entering directly into the contact or through holes between the first and second wires.

With the plasma damage evaluation method of the third aspect, we can estimate the hot carrier lifetime only by applying the first and second voltages for a short time for the measurement of the parameter value. Accordingly, this method allows a low-cost, high-precision, short-time evaluation of the plasma damage to the insulating films from the charge entering directly into the contact or through holes.

With the plasma damage evaluation method of the fourth aspect, we can readily detect electrons entering into the plurality of contact or through holes when the plasma etch method is applied to the step (e) or (g).

Thus, an objective of the present invention is to achieve an especially high-sensitivity detection test structure that detects the impact of charges entering directly into contact or through holes on gate insulating films, and to obtain a plasma damage evaluation method using the detector.

These and other objects, features, aspects and advantages of the present invention will become more apparent from the following detailed description of the present invention when taken in conjunction with the accompanying drawings.

BRIEF DESCRIPTION OF THE DRAWINGS

FIG. 1 is a schematic diagram showing the structure of a plasma damage detection test structure according to a first preferred embodiment of the present invention.

DESCRIPTION OF THE PREFERRED EMBODIMENTS

1. First Preferred Embodiment

FIG. 1 shows a plasma damage detector PDI using multilayer interconnections as plasma damage antennas. In FIG. 1, the gate of a MOS transistor M1 is connected to a first layer antenna ATL1 via a first layer wire IL1$a$. The first layer wire IL1$a$ is connected to a second layer antenna ATL2 via a contact hole H1 and a second layer wire IL2. Further, the second layer wire IL2 is connected to a third layer antenna ATL3 via a contact hole H2 and a third layer wire IL3. The contact hole H2 is connected via a first layer wire IL1$b$ to the cathode of a protective diode D1 whose anode is grounded (potential GND). It is noted that FIG. 1 is only a schematic diagram in which the first layer wire IL1$a$ and the first layer antenna ATL1 are, for example, different portions of the same continuous wire in the actual device structure. Further, "first-layer" indicates the first layer of the multilayer interconnections that are sectioned by interlayer insulating films in the actual device structure. For instance, the first layer wire IL1$a$ indicates the first interconnection layer formed in series with a gate electrode of the actual MOS transistor M1. Accordingly, the first layer wires IL1$a$ and IL1$b$ are closer to the substrate SUB on which the MOS transistor M1 is formed, than the second layer wire IL2 and the third layer wire IL3, and the third layer wire IL3 is farther from the substrate SUB than the first layer wires IL1$a$, IL1$b$ and the second layer wire IL2.

The detection test structure PD0 in FIG. 1 is designed to examine the impact of charges accumulated only by the first layer antenna ATL1 on the MOS transistor M1. Thus, the protective diode D1 is provided in order to pass the charge accumulated by the second layer antenna ATL2 in forming the second layer wire IL2 and the second layer antenna ATL2 and the charge accumulated by the third layer antenna ATL3 in forming the third layer wire IL3 and the third layer antenna ATL3, to the ground. However, the protective diode D1 is ineffective against the electrons entering into the first layer wires IL1$a$, IL1$b$ and the first layer antenna ATL1 and the electrons going through the second layer wire IL2 and then entering directly into the contact hole H1 to reach the first layer wire IL1$a$.

We will now describe a plasma damage detection test structure with such antennas, which can readily accumulate the charges entering directly into the contact or through holes.

Figure 2:
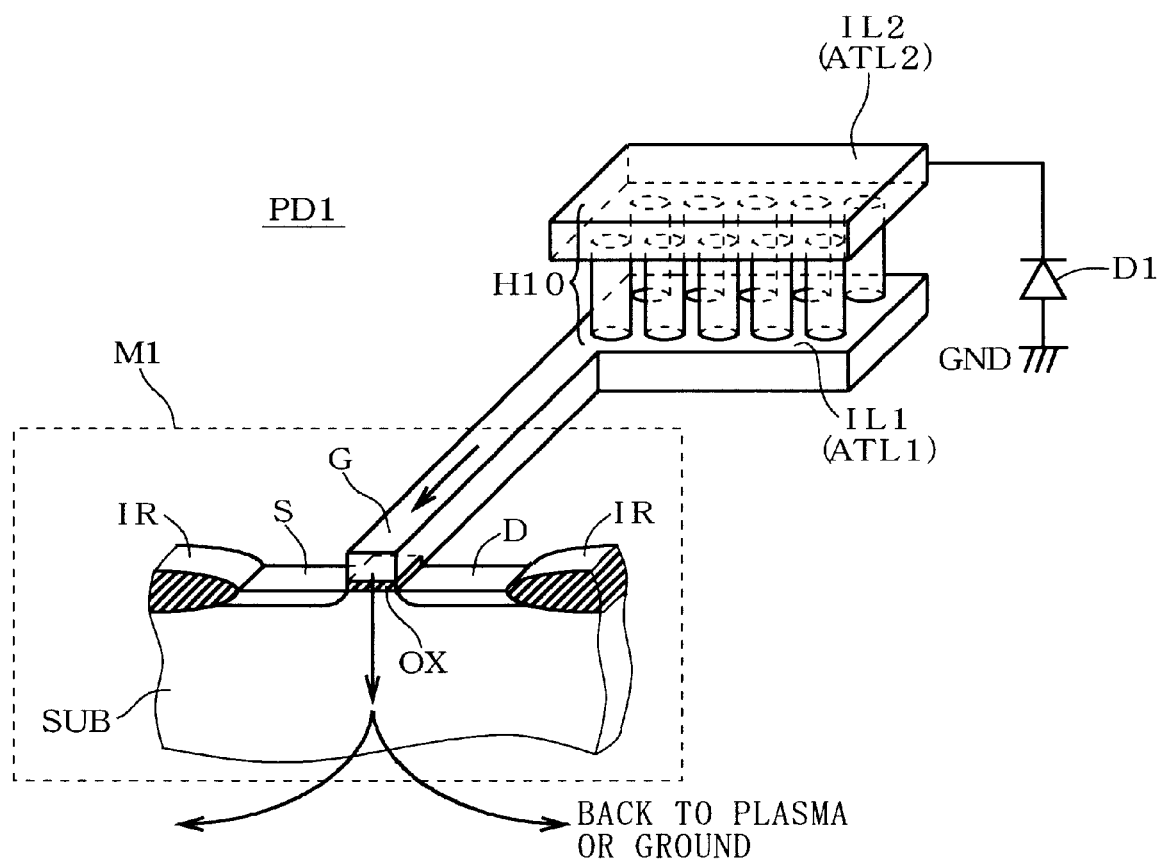
FIG. 2 shows the structure of the plasma damage detection test structure according to the first preferred embodiment of the present invention.

FIG. 2 shows a plasma damage detector PD1 according to the first preferred embodiment. The detector PD1 is a concrete example of the detection test structure PD0 in FIG. 1, excluding the third layer wire IL3 and the third layer antenna ATL3. The MOS transistor M1 in the detection test structure PD1 consists of, like the aforementioned conventional detectors PD2 and PD3, the gate insulating film OX and the gate electrode G formed on the surface of the substrate SUB isolated by the element isolation regions IR that are formed by the LOCOS method, etc., and the source/drain regions S, D with carriers injected therein.

The detection test structure PD1 further comprises a first layer wire IL1 formed in series with the gate electrode G, and a second layer wire IL2 connected to the first layer wire IL1 via a contact hole group H10. In the detector PD1, a portion of the first layer wire IL1 and a portion of the second layer wire IL2 where the contact hole group H10 exists correspond to the first layer antenna ATL1 and the second layer antenna ATL2 in FIG. 1, respectively. It is noted that the contact hole group H10 is a plurality of contact holes disposed across the first layer wire IL1 and the second layer wire IL2. Increase in the number of holes in the contact hole group H10 leads to increase in the number of entering electrons, which allows higher-sensitivity detection of the impact of electrons entering into the contact hole group H10 on the gate insulating film OX. The aforementioned protective diode D1 is provided on the second layer wire IL2.

We will now describe the fabrication process of the plasma damage detector PD1 as well as describing how electrons enter into the contact hole group H10. Assume that the protective diode D1 has already been formed by the other process, for example, using a PN junction area.

First, element isolation regions IR are formed on the surface of the substrate SUB by the LOCOS method, etc. Then, an insulating film to be a material for the gate insulating film OX is formed on the surface of the substrate SUB with no element isolation region IR (i.e., active region). On the insulating film, a conductive material to be the first layer wire IL1 and the gate electrode G is formed and then patterned so that the first layer wire IL1 and the gate electrode G are formed. At that time, the insulating film is also patterned in a self-aligned manner. Thus, the gate insulating film OX is formed at the same time. If the patterning is performed by means of plasma etching, the first layer wire IL1 and the gate electrode G will receive plasma damage.

Next, an interlayer insulating film (not shown) is formed, totally covering the first layer wire IL1, and then patterned so that the contact hole group H10 is formed in the portion of the first layer wire ILI corresponding to the antenna ATL1. If the formation of the contact hole group H10 is performed by means of plasma etching, electrons will enter into the contact hole group H10, inflicting plasma damage on the first layer wire IL1. Then, a conductive material to be the second layer wire IL2 is formed in the contact hole group H10, covering the interlayer insulating film, and then patterned so that the second layer wire IL2 is finally formed. At this time, the second layer wire IL2, is formed so as to be connected to the cathode of the protective diode D1. If the formation of the second layer wire E12 is performed by means of plasma etching, electrons will enter into the conductive material.

The protective diode D1 connected to the second layer wire IL2 has a function to dissipate the electrons which entered at the time of forming the second layer wire IL2, to the ground. However, the electrons going through the conductive material and entering directly into the contact hole group H10 will enter into the first layer wire IL1. That is, out of the electrons entering into the second layer wire IL2, the protective diode D1 directs only the electrons entering directly into the contact hole group H10 to the gate electrode G. Accordingly, by comparing damage evaluation results before and after the formation of the second layer wire IL2 and the contact hole group H10, it becomes possible to detect the impact of only the electrons entering directly into the contact hole group H10 on the gate insulating film.

Thus, the plasma damage detection test structure PD1 according to the first preferred embodiment can detect, especially with high sensitivity, the impact of the charges entering directly into the contact holes on the gate insulating film.

While the first preferred embodiment is directed to the damage to the gate insulating film from the electrons entering into the contact holes between the wire and the gate electrode, the same principle is applicable in detecting damages to the gate insulating film from electrons entering into the through holes between the multilayer interconnections. For this, such a device is used that a through hole group is provided between the (N+1)-th layer and the N-th layer wire (N>1) which is connected to the gate electrode G at least via either of contact holes, through holes, or wires. In this case, the impact of electrons entering directly into the through hole group on the gate insulating film can be detected by comparing the damage evaluation results after the formation of the N-th layer wire and after the formation of the (N+1)-th layer wire and the through hole group.

2. Second Preferred Embodiment

Figure 7A:
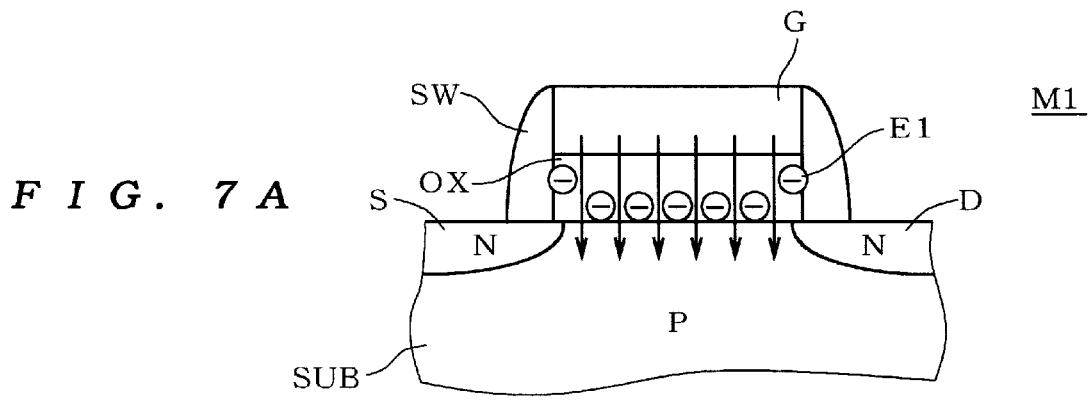
Figure 7B:
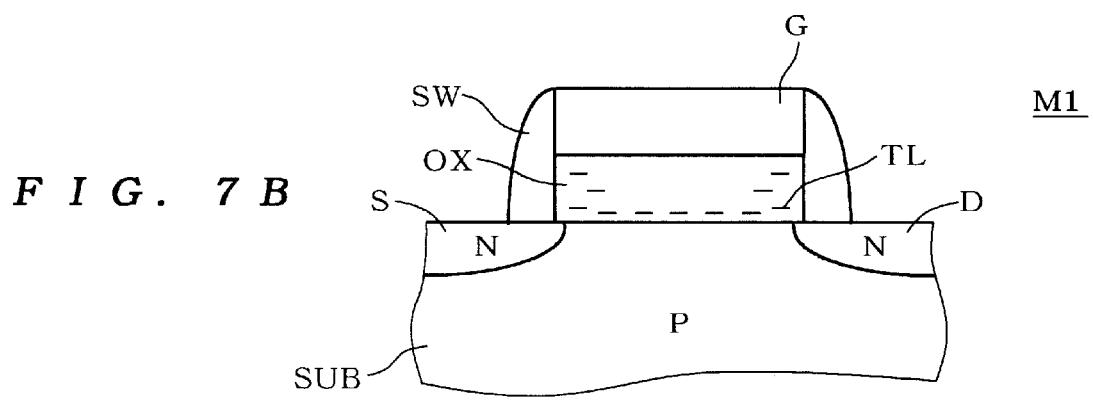
Figure 7C:
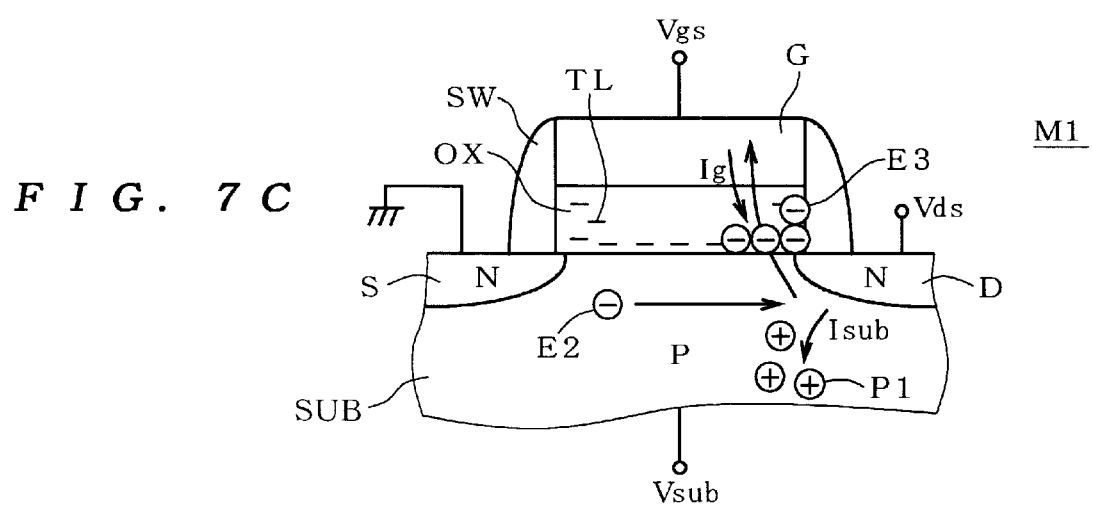
Figure 8:
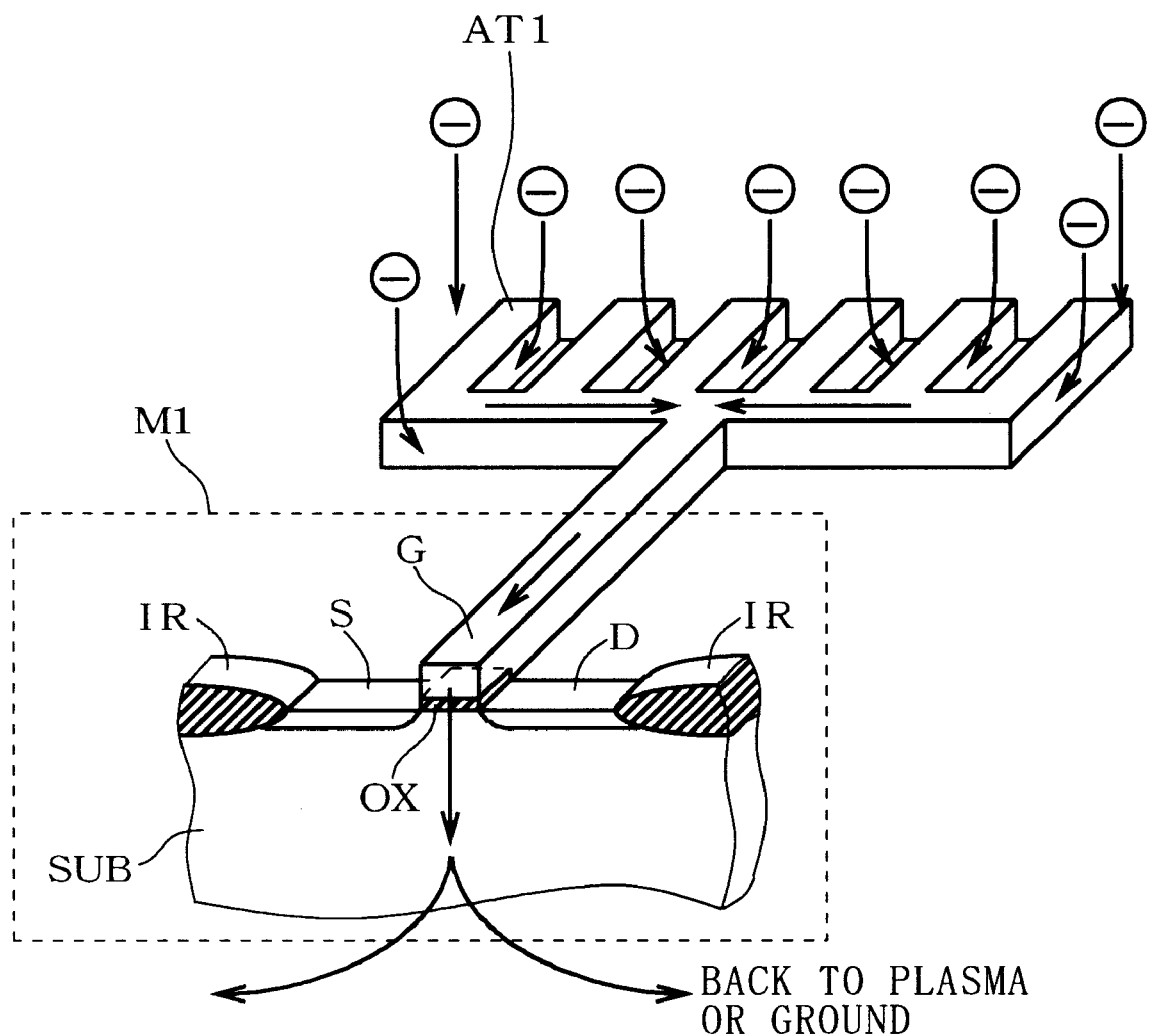
FIGS. 8 and 9 illustrate conventional techniques.
Figure 9:
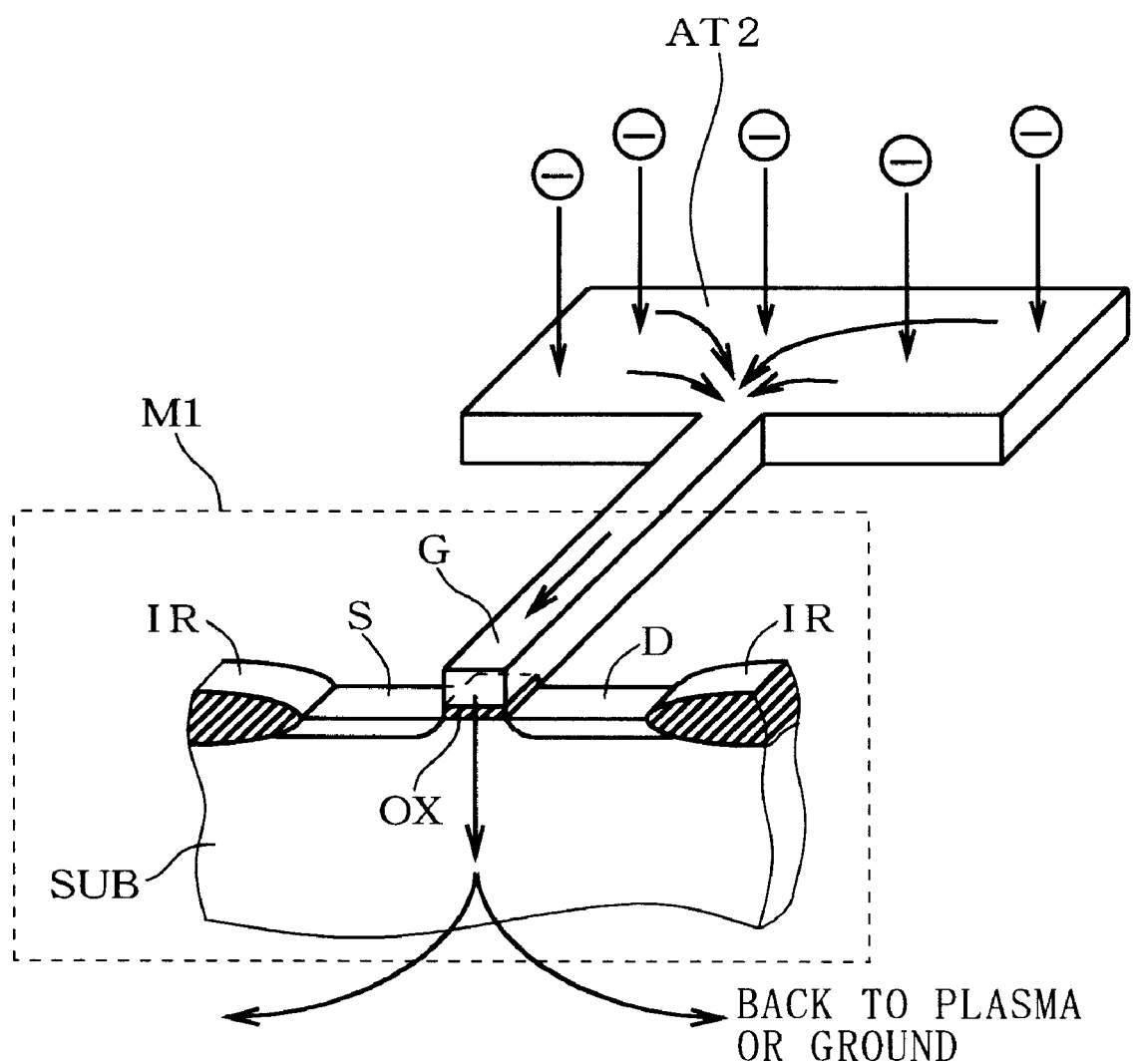

A second preferred embodiment is a plasma damage evaluation method utilizing the plasma damage detection test structure PD1 of the first preferred embodiment. We will now describe the outline of plasma damage evaluation methods. As shown in FIGS. 7A through 7C, the plasma damage on the gate insulating film OX generates the trap levels TL inside the gate insulating film OX, in which the electrons E3 tend to be trapped. This results in degradation in transistor characteristics such as threshold voltage, but conversely speaking, this mechanism may be utilized. That is, by previously generating hot carriers intentionally in the MOS transistor M1 and obtaining a correlation between a given parameter and an MOS transistor lifetime in that case, from then on, the MOS transistor lifetime can be estimated only from the measurement of that parameter and thus plasma damage can be evaluated.

One of examples of such plasma damage evaluation methods is a method for monitoring degradation in mutual conductance or threshold voltage of MOSFETs, e.g., a technique disclosed in Japanese Patent Laid-Open No. 8-288350A. In the present specification, however, the plasma damage detector PD1 adopts a plasma damage evaluation method disclosed by H. Watanabe et al., in "Effect of Plasma-Induced Damage on MOSFET Reliability", Technical Report of IEICE, R95-25, pp. 37–41 (1995-11).

We will now give a detailed description of this plasma damage evaluation method.

First as a preparation, a correlation between a given parameter and the MOS transistor lifetime is obtained. That is, each operating characteristic of the plasma-damaged MOS transistor M1 in the detector PD1 is measured, and a drain-source voltage Vds (e.g., about 6 to 7.5 V) slightly higher than a usual operating voltage (e.g., 5V) is applied to the MOS transistor M1 while controlling and leaving the gate-source voltage Vgs so that the substrate current Isub reaches at its maximum. This induces hot carriers in the MOS transistor M1. Then, an actual hot carrier lifetime of the MOS transistor is measured.

Here, the hot carrier lifetime indicates a time required for a given parameter (hereinafter referred to as "first parameter") of the MOS transistor M1 to deteriorate from its initial value to a given value when a stress voltage is applied to the MOS transistor M1 so as to induce hot carriers. It is said that a longer hot carrier lifetime results in a smaller plasma damage, or conversely that a shorter hot carrier lifetime results in a greater plasma damage. Further, a threshold voltage Vth or current Ids is often adopted as the first parameter. As to the degradation value for determining the lifetime, the value for the threshold voltage Vth is often obtained by subtracting 50 mV or 100 mV from its initial value; and the value for the current Ids is often obtained by subtracting 10% from its initial value.

At the same time, another parameter (hereinafter referred to as "second parameter") is also measured which is correlated with the hot carrier lifetime and allows an estimation of the hot carrier lifetime from a short-time measurement. The second parameter is, for example, a degradation rate of the current Ids one second after the application of a stress voltage, or a gate current Ig or a substrate current Isub during the early stages of the stress-voltage application. Here, the degradation rate of the current Ids is obtained by:

$$\text{Degradation Rate } (\%) = \frac{\text{Initial Value} - \text{Value after Stress Voltage Application}}{\text{Initial Value}} \times 100$$

Then, a correlation between the hot carrier lifetime and the second parameter is recorded for each characteristic of the MOS transistor M1.

Using such correlation records enables the plasma damage detector PD1 which is integrally formed in a portion of the product wafer to make a short-time, low-cost, high-precision evaluation of the plasma damage on the product wafer. This is because the hot carrier lifetime can be estimated only by measuring the second parameter when a stress voltage is applied to the after-process detector PD1 for a short time and examining the correlation records.

Figure 3:
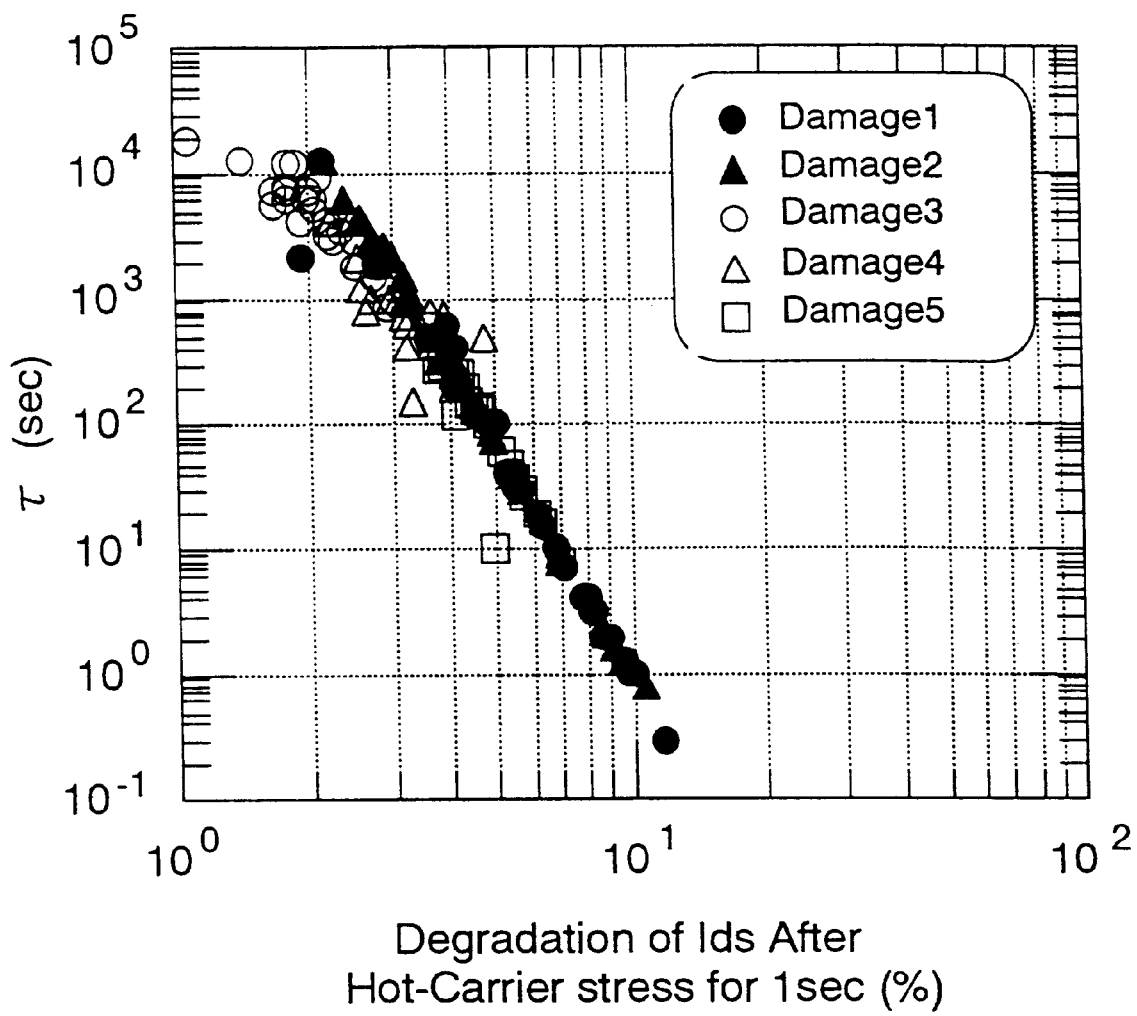
FIG. 3 shows a correlation between a hot carrier lifetime τ and a degradation rate of a current Ids one second after the application of a stress voltage, used in a plasma damage evaluation method according to a second preferred embodiment of the present invention.

FIG. 3 is a graph showing, for example, a correlation between a hot carrier lifetime τ and a degradation rate of the current Ids one second after the application of a stress voltage. The graph shows data of the plasma-damaged MOS transistor at five stages. In either case, data is on the same straight line, showing a considerably high correlation.

Figure 4:
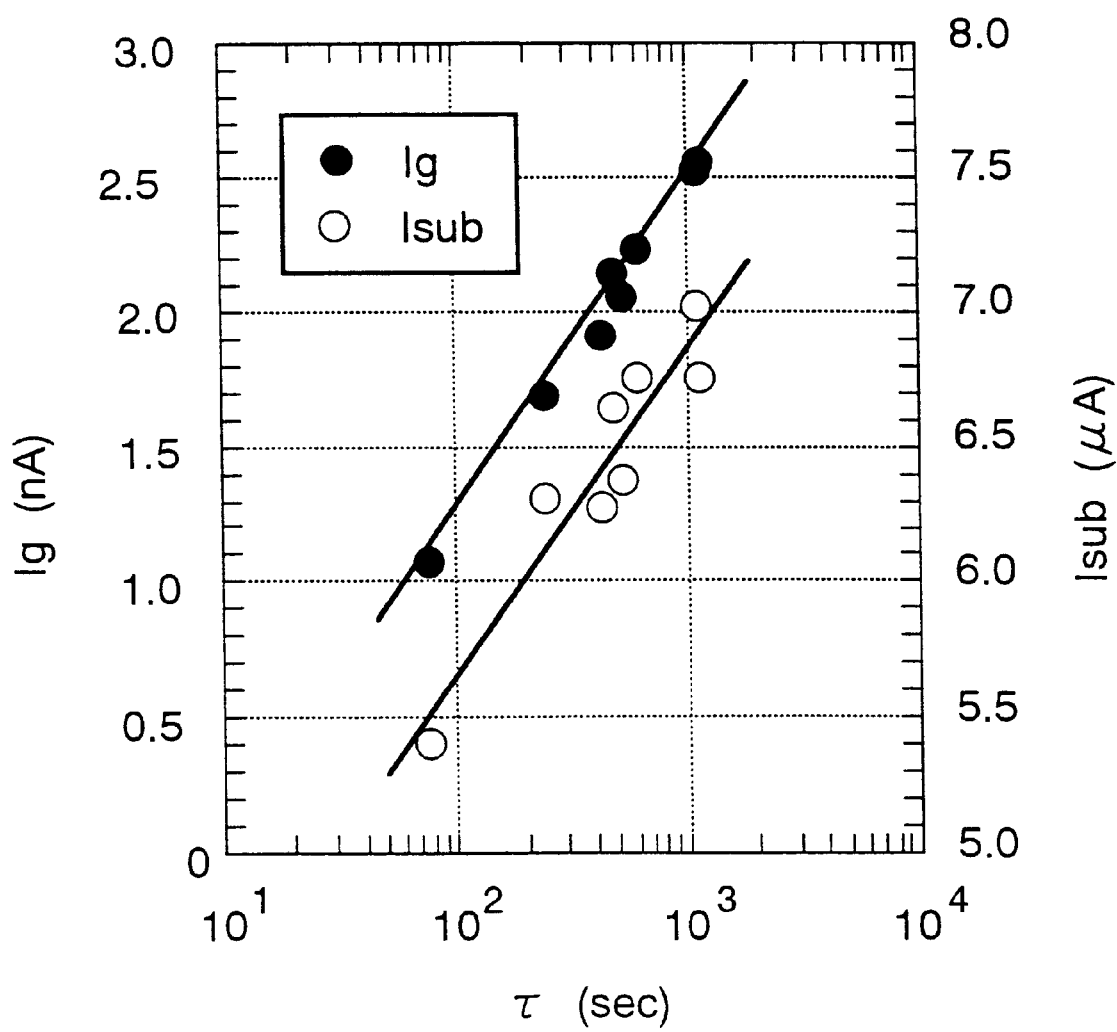
FIG. 4 shows a correlation between the hot carrier lifetime τ, a gate current Ig, and a substrate current Isub, used in the plasma damage evaluation method according to the second preferred embodiment of the present invention.
Figure 5:
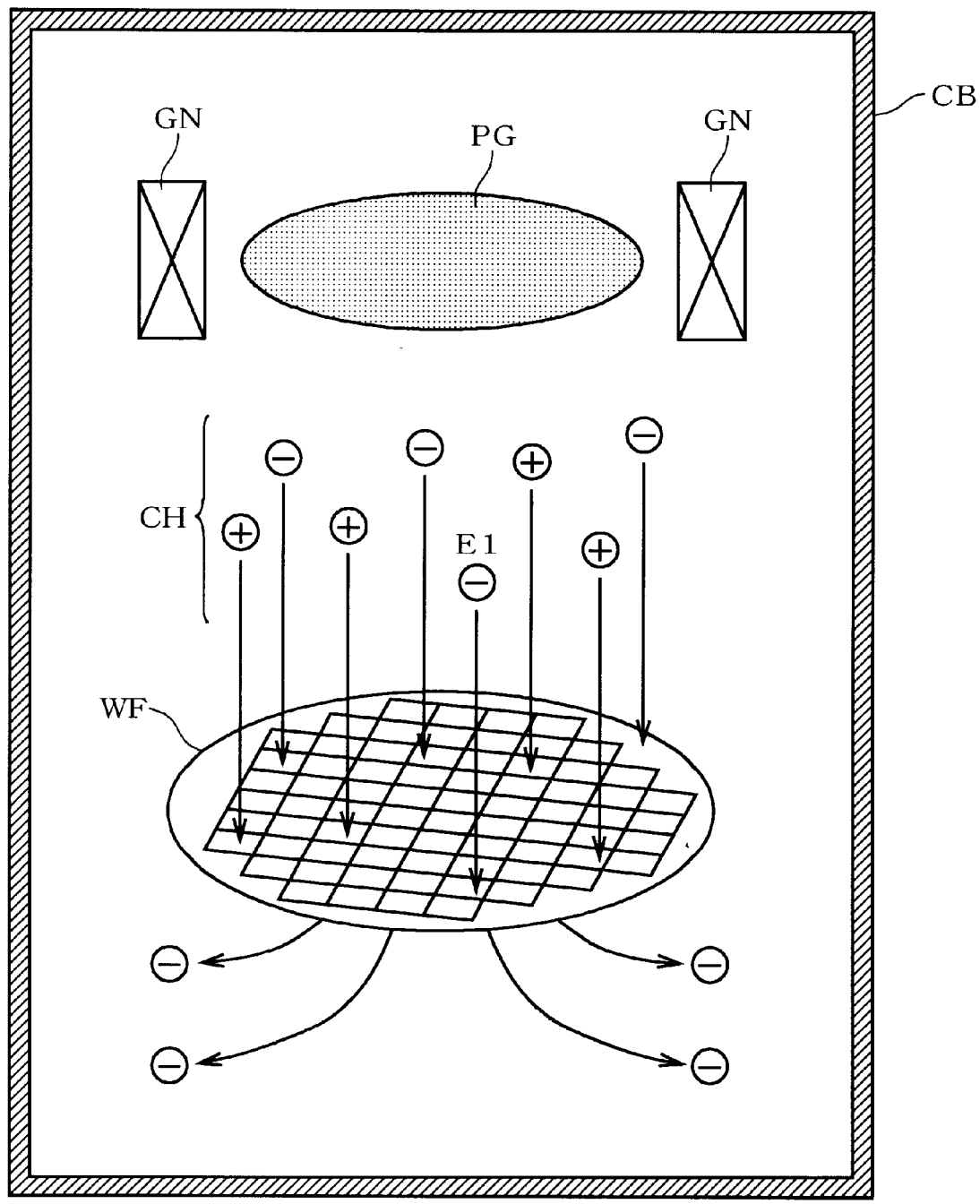
FIGS. 5, 6, and 7A through 7C are diagrams to describe the problems to be solved by the present invention.
Figure 6:
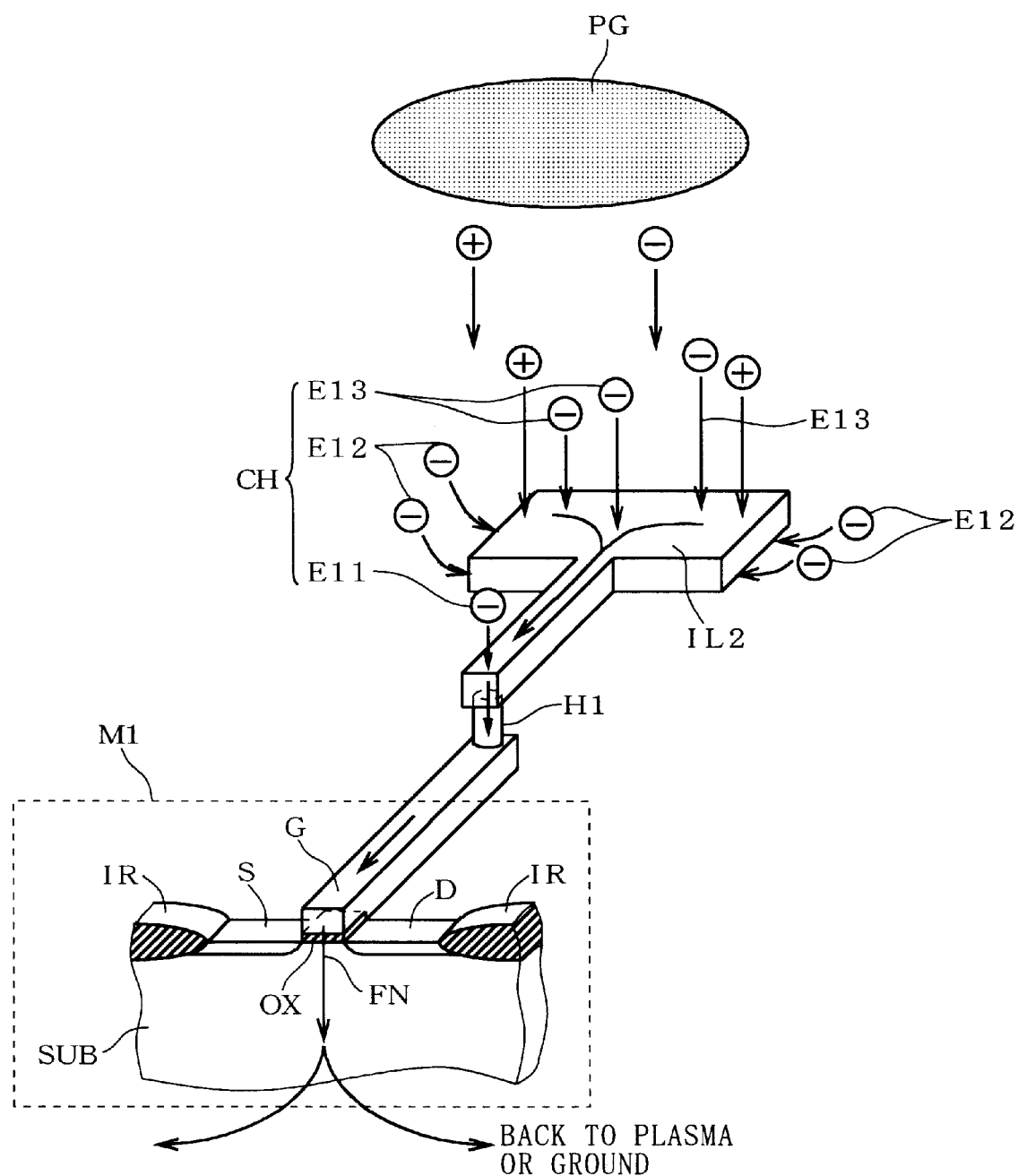

FIG. 4 is a graph showing, for example, a correlation between the hot carrier lifetime τ, and the gate current Ig and the substrate current Isub both during the early stages of the stress-voltage application. The graph shows data of the MOS transistor receiving various levels of plasma damage. In either case, data is on the same straight line, showing a considerably high correlation.

Accordingly, with the plasma damage evaluation method according to the second preferred embodiment of the present invention, we can make a low-cost, high-precision, short-time evaluation of the plasma damage on the detection test structure PD1 only by examining the degradation rate of the current Ids one second after the stress-voltage application, or the gate current Ig or the substrate current Isub both during the early stages of the stress-voltage application in the plasma damage detection test structure PD1. Further, the use of the detection test structure PD1 allows a high-sensitivity evaluation of the plasma damage by the charge entering directly into the contact holes. The same can be said of the through holes between the multilayer interconnections. In that case, plasma damage by the electrons entering into the through holes can be evaluated by utilizing the aforementioned method and a device that increases sensitivity to the plasma damage by disposing a plurality of holes between the interconnection layers While the invention has been described in detail, the foregoing description is in all aspects illustrative and not restrictive. It is understood that numerous other modifications and variations can be devised without departing from the scope of the invention.

I claim:

1. A plasma damage detection test structure comprising:
   a semiconductor substrate having a surface;
   first and second current electrodes provided apart from each other in said surface of said semiconductor substrate;
   a first insulating film provided on said surface of said semiconductor substrate sandwiched between said first and second current electrodes;
   a control electrode opposed to said semiconductor substrate with said first insulating film therebetween;
   a first wire connected to said control electrode;
   a second wire connected to said first wire and located further from said semiconductor substrate than said first wire; and
   a second insulating film between said first wire and said second wire, wherein said second wire is connected to said first wire through a plurality of contact or through holes in said second insulating film, wherein said plurality of contact or through holes are provided in parallel between said first and second wiring layers.

2. The plasma damage detection test structure of claim 1, further comprising:
   a diode whose anode is grounded and whose cathode is connected to said second wire.

3. A plasma damage evaluation method using the plasma damage detection test structure of claim 1, said plasma damage evaluation method comprising the steps of:
   applying a first voltage between said first and second current electrodes;
   measuring a parameter of said plasma damage detector in applying a second voltage between said control electrode and said second current electrode; and
   evaluating plasma damage by estimating a value of a hot carrier lifetime from a known correlation between said hot carrier lifetime and said parameter,
   wherein said plasma damage detection test structure further comprises a diode comprising a grounded anode and a cathode connected to said second wire.

4. The plasma damage evaluation method of claim 3, wherein
   said hot carrier lifetime is a time required for a threshold voltage of said plasma damage detector to deteriorate into a predetermined value from an initial value, when said first and second voltages are controlled to induce hot carriers in a first current that flows between said first and second current electrodes.

5. The plasma damage evaluation method of claim 4, wherein
   said parameter is a value obtained by dividing, by an initial value of said first current, a difference between said initial value and a value of said first current after a predetermined period of time since said first and second voltages are controlled to induce said hot carriers.

6. The plasma damage evaluation method of claim 4, wherein
   said parameter is a current caused by electrons that migrate from the vicinity of said first current electrode to said control electrode through said insulating film in said semiconductor substrate when said first and second voltages are controlled to induce said hot carriers.

7. The plasma damage evaluation method of claim 4, wherein
   said parameter is a current caused by holes that migrate from the vicinity of said first current electrode to a portion receiving a substrate potential in said semiconductor substrate when said first and second voltages are controlled to induce said hot carriers.

8. The plasma damage evaluation method of claim 3; wherein
   said hot carrier lifetime is a time required for a first current that flows between said first and second current electrodes to deteriorate into a predetermined value from an initial value when said first and second voltages are controlled to induce hot carriers in said first current.

9. The plasma damage evaluation method of claim 8, wherein
   said parameter is a value obtained by dividing, by an initial value of said first current, a difference between said initial value and a value of said first current after a predetermined period of time since said first and second voltages are controlled to induce said hot carriers.

10. The plasma damage evaluation method of claim 8, wherein
    said parameter is a current caused by electrons that migrate from the vicinity of said first current electrode to said control electrode through said insulating film in said semiconductor substrate when said first and second voltages are controlled to induce said hot carriers.

11. The plasma damage evaluation method of claim 8, wherein
    said parameter is a current caused by holes that migrate from the vicinity of said first current electrode to a portion receiving a substrate potential in said semiconductor substrate when said first and second voltages are controlled to induce said hot carriers.

12. A plasma damage evaluation method comprising the steps of:
    preparing a semiconductor substrate having a surface;
    forming a first conductive material on said surface;
    patterning said first conductive material to form a first wire;
    forming an interlayer insulating film so as to cover said first wire;
    forming a plurality of contact or through holes in said interlayer insulating film across said first wire;
    forming a second conductive material so as to fill said plurality of contact or through holes; and patterning said second conductive material to form a second wire, wherein said plurality of contact or through holes are provided in parallel between said first and second wiring layers.

13. A plasma damage detection test structure, comprising:

a semiconductor substrate having a surface;

a source electrode and a drain electrode in said surface of said semiconductor substrate;

a gate insulating film between said source electrode and said drain electrode;

a gate electrode on said insulating film;

a first layer antenna connected to said gate electrode;

a second layer antenna connected to said first layer antenna and located above said first layer antenna; and an interlayer insulating film between said first layer antenna and said second layer antenna, wherein said second layer antenna is connected to said first layer antenna through a plurality of contact or through holes in said interlayer insulating film, wherein said plurality of contact or through holes are provided in parallel between said first and second wiring layers.

14. The plasma damage detection test structure of claim 13, further comprising a diode comprising a grounded anode and a cathode connected to said second layer antenna.

15. The plasma damage detection test structure of claim 13, further comprising:

a third layer antenna connected to said second layer antenna and located above said second layer antenna; and a second interlayer insulating film between said second layer antenna and said third layer antenna, wherein said third layer antenna is connected to said second layer antenna through a plurality of contact or through holes in said second interlayer insulating film.

* * * * *

UNITED STATES PATENT AND TRADEMARK OFFICE
CERTIFICATE OF CORRECTION

PATENT NO. : 6,353,235 B1
DATED : March 5, 2002
INVENTOR(S) : Hajime Watanabe

It is certified that error appears in the above-identified patent and that said Letters Patent is hereby corrected as shown below:

<u>Column 11,</u>
Line 11, -- gate -- is inserted between "said" and "insulating".

Signed and Sealed this

Fifth Day of November, 2002

Attest:

JAMES E. ROGAN
Attesting Officer     Director of the United States Patent and Trademark Office